(12) United States Patent
Holloway et al.

(10) Patent No.: US 11,879,952 B2
(45) Date of Patent: Jan. 23, 2024

(54) ATOMIC VAPOR CELL AND MAKING AN ATOMIC VAPOR CELL

(71) Applicant: Government of the United States of America, as represented by the Secretary of Commerce, Gaithersburg, MD (US)

(72) Inventors: Christopher Lee Holloway, Boulder, CO (US); John Edward Kitching, Boulder, CO (US); Alexandra Brae Artusio-Glimpse, Boulder, CO (US); Vladimir Anatolyevich Aksyuk, Gaithersburg, MD (US); Matthew Thomas Simons, Lafayette, CO (US); Omar Daniel Lopez, Gaithersburg, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 174 days.

(21) Appl. No.: 17/374,537

(22) Filed: Jul. 13, 2021

(65) Prior Publication Data
US 2022/0018914 A1    Jan. 20, 2022

Related U.S. Application Data

(60) Provisional application No. 63/051,580, filed on Jul. 14, 2020.

(51) Int. Cl.
*G01R 33/26* (2006.01)

(52) U.S. Cl.
CPC .................................. *G01R 33/26* (2013.01)

(58) Field of Classification Search
CPC  G01R 33/26; G01R 29/0885; G01R 33/0052; G01R 3/00
(Continued)

(56) References Cited

U.S. PATENT DOCUMENTS 6,806,784 B2    10/2004  Hollberg et al.
10,605,840 B1 *  3/2020  Amarloo ............ G01R 29/0885
(Continued)

OTHER PUBLICATIONS

Liew, L-A., et al., "Microfabricated alkali atom vapor cells", Applied Physics Letters, 2004, p. 2694-2696, vol. 84 No. 14.
(Continued)

*Primary Examiner* — Christopher P McAndrew
(74) *Attorney, Agent, or Firm* — Office of Chief Counsel for National Institute of Standards and Technology (57) ABSTRACT

An atomic vapor cell for performing RF measurements includes: a first optical window of transparent nonconducting material free of electrically conductive materials; an intermediate frame of transparent nonconducting material free of electrically conductive materials; a second optical window disposed on the intermediate frame and including transparent nonconducting material free of electrically conductive materials to minimize distortion of radiofrequency fields by the windows and frame; and a cell aperture, wherein the atomic vapor cell is hermetically sealed by bonding between the first optical window and the second optical window to the intermediate frame.

27 Claims, 7 Drawing Sheets

(58) Field of Classification Search
USPC .......................................................... 324/305
See application file for complete search history.

(56) References Cited

U.S. PATENT DOCUMENTS

| | | | |
|---|---|---|---|
| 10,859,981 B1* | 12/2020 | Ramirez-Serrano | .... C03C 27/06 |
| 2005/0007118 A1 | 1/2005 | Kitching et al. | |
| 2016/0363617 A1 | 12/2016 | Anderson et al. | |
| 2020/0002802 A1* | 1/2020 | Kitching | ................. B23K 1/20 |
| 2021/0114926 A1 | 4/2021 | Ramirez-Serrano et al. | |
| 2021/0132549 A1 | 5/2021 | Ramirez-Serrano et al. | |
| 2021/0156735 A1* | 5/2021 | Amarloo | ............... G01J 1/0223 |
| 2021/0156898 A1 | 5/2021 | Amarloo et al. | |

OTHER PUBLICATIONS

Knappe, S., et al., "Atomic vapor cells for chip-scale atomic clocks with improved long-term frequency stability", Optics Letters, 2005, p. 2351-2353, vol. 30 No. 18.

Liew, L-A., et al., "Wafer-level filling of microfabricated atomic vapor cells based on thin-film deposition and photolysis of cesium azide", Applied Physics Letters, 2007, p. 114106, vol. 90.

Nieradko, L., et al., "ew approach of fabrication and dispensing of micromachined cesium vapor cell", Journal of Micro/Nanolithography, MEMS, and MOEMS, 2008, p. 033013, vol. 7 No. 3.

Woetzel, S., et al., "Microfabricated atomic vapor cell arrays for magnetic field measurements", Review of Scientific Instruments, 2011, p. 033111, vol. 82.

Karlen, S., et al., "MEMS atomic vapor cells sealed by Cu—Cu thermocompression bonding", IEEE, 2017, p. 625-627.

Maurice, V., et al., "Microfabricated vapor cells filled with a cesium dispensing paste for miniature atomic clocks", Applied Physics Letters, 2017, p. 164103, vol. 110.

Kurashima, Y., et al., "An all-sapphire Cs gas cell for a chip-scale atomic clock", Japanese Journal of Applied Physics, 2019, p. 096506, vol. 58.

Abdullah, S., et al., "Aging studies on micro-fabricated alkali buffer-gas cells for miniature atomic clocks", Applied Physics Letters, 2015, p. 163505, vol. 106.

Straessle, R., et al., "Microfabricated alkali vapor cell with antirelaxation wall coating", Applied Physics Letters, 2014, p. 043502, vol. 105.

Wallis, G., "Field Assisted Glass Sealing", Electrocomponent Science and Technology, 1975, p. 45-53, vol. 2 No. 1.

Knowles, K.M., et al., "Anodic bonding", International Materials Review, 2006, p. 273-311, vol. 51 No. 5.

* cited by examiner

ATOMIC VAPOR CELL AND MAKING AN ATOMIC VAPOR CELL

CROSS REFERENCE TO RELATED APPLICATIONS

The application claims priority to U.S. Provisional Patent Application Ser. No. 63/051,580 filed Jul. 14, 2020, the disclosure of which is incorporated herein by reference in its entirety.

ATOMIC VAPOR CELL AND MAKING AN ATOMIC VAPOR CELL STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, MD, 20899; voice 301-975-2573; email tpo@nist.gov; reference NIST Docket Number 20-057US1.

BRIEF DESCRIPTION

Disclosed is an atomic vapor cell for performing RF measurements, the atomic vapor cell comprising: a first optical window consisting essentially of transparent nonconducting material and comprising a first window bonding surface and a first cell window wall, the transparent nonconducting material of the first optical window being essentially free of electrically conductive materials including silicon to minimize distortion of radiofrequency fields by the first optical window; an intermediate frame, disposed on the first optical window, consisting essentially of transparent nonconducting material, and comprising: a first frame bonding surface opposing and bonded to the first window bonding surface, a second frame bonding surface, and a cell frame wall, the transparent nonconducting material of the intermediate frame being essentially free of electrically conductive materials including silicon to minimize distortion of radiofrequency fields by the intermediate frame; a second optical window disposed on the intermediate frame such that the intermediate frame is interposed between the first optical window and the second optical window, consisting essentially of transparent nonconducting material, and comprising: a second window bonding surface opposing and bonded to the second frame bonding surface, and a second cell window wall, the transparent nonconducting material of the second optical window being essentially free of electrically conductive materials including silicon to minimize distortion of radiofrequency fields by the second optical window; and a cell aperture bounded by the first cell window wall of the first optical window, the cell frame wall of the intermediate frame, and the second cell window wall of the second optical window, wherein the atomic vapor cell is hermetically sealed by bonding between the first optical window and the second optical window to the intermediate frame.

Disclosed is a process for making an atomic vapor cell using anodic bonding, the process comprising: providing a first optical window consisting essentially of transparent nonconducting material and comprising a first window bonding surface and a first cell window wall, the transparent nonconducting material of the first optical window being essentially free of electrically conductive materials including silicon to minimize distortion of radiofrequency fields by the first optical window; forming a first thin film comprising anodic bonding material on the first window bonding surface; disposing an intermediate frame on the first optical window, the intermediate frame consisting essentially of transparent nonconducting material, and comprising: a first frame bonding surface opposing the first window bonding surface, a second frame bonding surface, and a cell frame wall, the transparent nonconducting material of the intermediate frame being essentially free of electrically conductive materials including silicon to minimize distortion of radiofrequency fields by the intermediate frame; forming a second thin film comprising anodic bonding material on the second window bonding surface; anodically bonding the first frame bonding surface of the intermediate frame to the first window bonding surface of the first optical window; disposing a second optical window on the intermediate frame such that the intermediate frame is interposed between the first optical window and the second optical window, and the second optical window consisting essentially of transparent nonconducting material and comprising: a second window bonding surface opposing the second frame bonding surface, and a second cell window wall, the transparent nonconducting material of the second optical window being essentially free of electrically conductive materials including silicon to minimize distortion of radiofrequency fields by the second optical window; anodically bonding the second window bonding surface of the second optical window to the second frame bonding surface of the intermediate frame; forming, in response to the anodically bonding, a cell aperture bounded by the first cell window wall of the first optical window, the cell frame wall of the intermediate frame, and the second cell window wall of the second optical window; and hermetically sealing the atomic vapor cell in response to anodically bonding the first optical window and the second optical window to the intermediate frame to make the atomic vapor cell.

Disclosed is a process for making an atomic vapor cell using anodic bonding, the process comprising: providing a first optical window consisting essentially of transparent nonconducting material and comprising a first window bonding surface and a first cell window wall, the transparent nonconducting material of the first optical window being essentially free of electrically conductive materials including silicon to minimize distortion of radiofrequency fields by the first optical window; forming a first thin film comprising anodic bonding material on the first frame bonding surface; disposing an intermediate frame on the first optical window, the intermediate frame consisting essentially of transparent nonconducting material, and comprising: a first frame bonding surface opposing the first window bonding surface, a second frame bonding surface, and a cell frame wall, the transparent nonconducting material of the intermediate frame being essentially free of electrically conductive materials including silicon to minimize distortion of radiofrequency fields by the intermediate frame; forming a second thin film comprising anodic bonding material on the second frame bonding surface; anodically bonding the first frame bonding surface of the intermediate frame to the first window bonding surface of the first optical window; disposing a second optical window on the intermediate frame such that the intermediate frame is interposed between the first optical window and the second optical window, and the second optical window consisting essentially of transparent nonconducting material and comprising: a second window bonding surface opposing the second frame bonding surface, and a second cell window wall, the transparent nonconducting material of the second optical window being essentially free of electrically conductive materials including silicon to minimize distortion of radiofrequency fields by the second optical window; anodically bonding the second window bonding surface of the second optical window to the second frame bonding surface of the intermediate frame; forming, in response to the anodically bonding, a cell aperture bounded by the first cell window wall of the first optical window, the cell frame wall of the intermediate frame, and the second cell window wall of the second optical window; and hermetically sealing the atomic vapor cell in response to anodically bonding the first optical window and the second optical window to the intermediate frame to make the atomic vapor cell.

BRIEF DESCRIPTION OF THE DRAWINGS

The following description cannot be considered limiting in any way. With reference to the accompanying drawings, like elements are numbered alike.

FIG. 1 shows: (panel A) a cross-section of an atomic vapor cell; and (panel B) an exploded cross-sectional view of the atomic vapor cell;

FIG. 2 shows: (panel A) a cross-section of steps in making an atomic vapor cell, wherein anodic bonding material is formed on a frame bonding surface of an intermediate frame; and (panel B) a cross-section of steps in making an atomic vapor cell, wherein anodic bonding material is formed on a window bonding surfaces of a first optical window and a second optical window;

FIG. 4 shows exploded views several atomic vapor cells with various cell apertures, wherein panel A shows an atomic vapor cell with a round cross-sectional cylindrical cell aperture; panel B shows an atomic vapor cell with a plurality of round cross-sectional cylindrical cell apertures; panel C shows an atomic vapor cell with a plurality of round cross-sectional cylindrical cell apertures; and panel D shows an atomic vapor cell with a plurality of rectangular cross-sectional parallelepiped cell apertures;

FIG. 5 shows: (panel A) an intermediate frame with a one-dimensional array of rectangular cell apertures, (panel B) an intermediate frame with a one-dimensional array of rectangular cell apertures that are interconnected by trenches 220; and (panel C) an intermediate frame with a two-dimensional array of circular cell apertures;

DETAILED DESCRIPTION

A detailed description of one or more embodiments is presented herein by way of exemplification and not limitation.

Atomic sensors control room temperature atoms in devices such as SI-traceable E-field probes an in other applications ranging from atom-based receivers to imaging machines. Applications of this sensor technology involve Rydberg atom-based detectors, sensors, and receivers. Further development of atomic sensors needs economic designs and fabrication processes. The atomic vapor cell and process for making it herein described provide cost effective production using batch microfabrication. Beneficially, atomic vapor cell and process for making herein include placing thin-narrow layer of silicon (Si) onto glass windows such that they can be anodically bonded to form small glass cells, drilling holes in plates of glass in order to make single vapor cells or an array of vapor cells for which windows are anodically bonded, and filling and anodically bonding windows to glass cells.

Microfabricated alkali vapor cells, based on anodic bonding of silicon and glass, can be made from large wafers such that the cost per cell is significantly lower than conventional glass cells. However, for certain applications, such as sensing of radiofrequency (RF) fields, electrically conductive materials such as silicon in the vapor cell should be minimized because such materials may distort or entirely block the RF field.

It has been discovered a method for making an atomic vapor cell at the wafer-level that minimizes the amount of silicon used in the process and in the formed atomic vapor cell. Instead of making a frame onto which glass is bonded out of silicon, making an atomic vapor cell includes a glass wafer in which holes that form cell apertures are etched or abrasively machined. A thin layer, e.g., of polysilicon is deposited onto the top and bottom surfaces of the glass in some embodiments. In a certain aspect, top and bottom glass windows serve as lids that are bonded onto the polysilicon layer to seal the alkali atoms in the atomic vapor cell. Because almost all of the resulting atomic vapor cell is glass, and not silicon, the atomic vapor cell has a much smaller effect on the RF field than a conventional cell with silicon walls.

Atomic vapor cell 200 minimizes perturbations to RF fields caused by interaction of the material of construction of atomic vapor cell 200 with the RF field due to making atomic vapor cell 200 with a small, controlled amount of semiconductive materials such as silicon so that the bulk of atomic vapor cell 200 is transparent nonconducting material. In an embodiment, with reference to FIG. 1, FIG. 2, FIG. 3, and FIG. 4, atomic vapor cell 200 is configured for performing RF measurements and includes: first optical window 201 consisting essentially of transparent nonconducting material and comprising first window bonding surface 204.1 and first cell window wall 207.1, the transparent nonconducting material of first optical window 201 being essentially free of electrically conductive materials including silicon to minimize distortion of radiofrequency fields by first optical window 201; intermediate frame 203, disposed on first optical window 201, consisting essentially of transparent nonconducting material, and comprising: first frame bonding surface 205.1 opposing and bonded to first window bonding surface 204.1, second frame bonding surface 205.2, and cell frame wall 208, the transparent nonconducting material of intermediate frame 203 being essentially free of electrically conductive materials including silicon to minimize distortion of radiofrequency fields by intermediate frame 203; a second optical window 202 disposed on intermediate frame 203 such that intermediate frame 203 is interposed between first optical window 201 and second optical window 202, consisting essentially of transparent nonconducting material, and comprising: second window bonding surface 204.2 opposing and bonded to second frame bonding surface 205.2, and second cell window wall 207.2, the transparent nonconducting material of second optical window 202 being essentially free of electrically conductive materials including silicon to minimize distortion of radiofrequency fields by second optical window 202; and cell aperture 206 bounded by first cell window wall 207.1 of first optical window 201, cell frame wall 208 of intermediate frame 203, and second cell window wall 207.2 of second optical window 202, wherein atomic vapor cell 200 is hermetically sealed by bonding between first optical window 201 and second optical window 202 to intermediate frame 203.

In an embodiment, atomic vapor cell 200 includes atomic vapors of alkali metal atoms disposed in cell aperture 206. According to an embodiment, atomic vapor cell 200 includes a source of atomic vapors of alkali metal atoms disposed in cell aperture 206. The source can be, e.g., a pellet of a compound or composition that includes alkali metal. The source can be subjected heating, irradiation, and the like to produce the atomic vapor of the alkali metal atoms. Exemplary alkali metals include cesium and rubidium.

In an embodiment, such as shown in FIG. 4, atomic vapor cell 200 includes additional cell apertures 206, wherein each of the cell apertures 206 is sealed from one another such that each cell aperture 206 is fluidically isolated from all other cell apertures 206. In this manner the individual cell apertures 206 can independently include atomic vapors, wherein the atomic vapor in individual cells is the same or different. Moreover, an array of cell apertures 206 (e.g., panel C or panel D of FIG. 4) in atomic vapor cell 200 can be used as a sensor array, e.g., in an imaging device such as an RF camera. The number of cell aperture 206 can be any number selected for a particular application such as providing a high numerical aperture, high spatial resolution, metamaterial design, optimizing field of view, making atomic vapor cell 200 compact, and the like. A shape of the cell aperture 206 can be selected for similar reasons. In a plurality of cell apertures 206, they can have same or different cross-sectional shapes such as a circular cross-section along lateral length 212 of cell aperture 206, an ellipsoidal cross-section along lateral length 212 of cell aperture 206, or a quadrilateral cross-section along lateral length 212 of cell aperture 206. Exemplary shapes of cell aperture 206 include a parallelepiped shape and a cylindrical shape.

Figure 6:
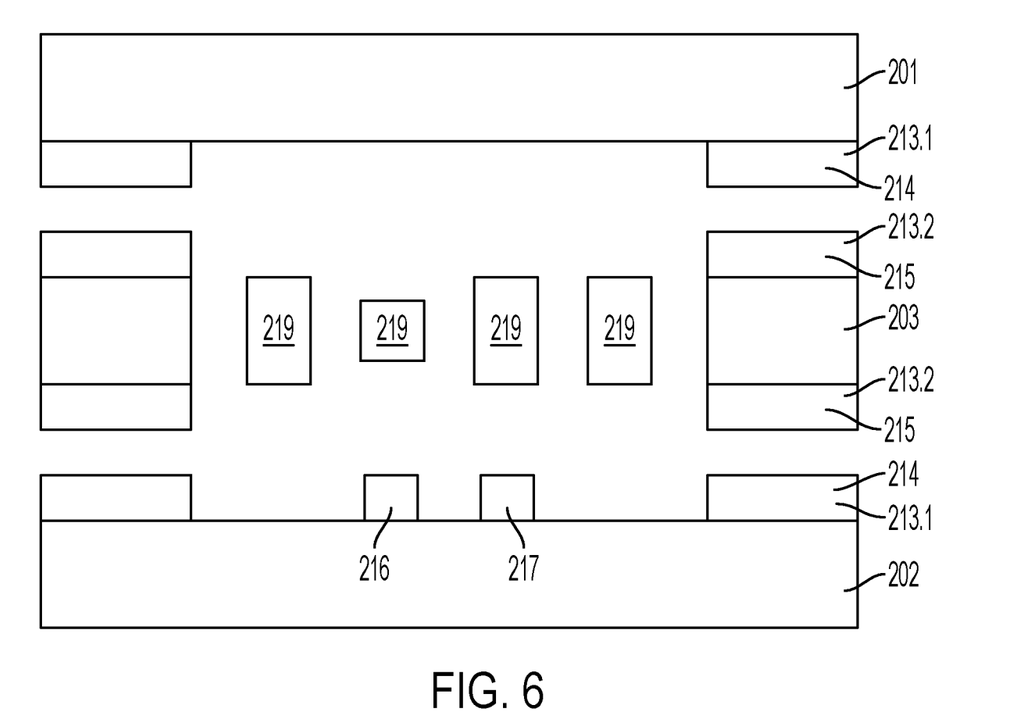
FIG. 6 shows components involved in making an atomic vapor cell according to the Example, wherein the cross-section shows that the all-dielectric atomic vapor cell includes upper window with silicon or borosilicate thin film coating that has been patterned, intermedia frame with upper and lower borosilicate or silicon thin film coatings that have been patterned and optionally including interframe structures 219, lower window with silicon or borosilicate thin film coating that has been patterned, an alkali atom source, and a reactive material as a getter for maintaining purity of vacuum inside the atomic vapor cell.

In an embodiment, in forming atomic vapor cell 200, e.g., with reference to FIG. 6, anodic bonding material 213.1 and second anodic bonding material 213.2 are interposed between first optical window 201 and intermediate frame 203 to bond intermediate frame 203 to first optical window 201, and anodic bonding material 213 interposed between second optical window 202 and intermediate frame 203 to bond intermediate frame 203 to second optical window 202. Here, anodic bonding material 213 can form siloxane bonds. In this respect, anodic bonding material 213 can be any material capable of forming bonds between first optical window 201 and intermediate frame 203 and forming bonds between intermediate frame 203 and second optical window 202 that preferentially does not produce a conductive layer therebetween and that preferentially minimizes interactions between atomic vapor cell 200 and RF fields that perturb the RF field. Exemplary anodic bonding material 213 is formed from silicon, borosilicate, polycrystalline silicon, or amorphous silicon and the like. It is contemplated that anodic bonding is formed between two dissimilar materials, wherein either both of these materials are disposed on opposite surfaces, or one of the components (e.g., first optical window 201 or intermediate frame 203) is made entirely out of one of these materials, e.g., borosilicate glass, in which case a thin film of the other material, e.g. silicon, polysilicon, amorphous silicon, is disposed on the opposing surface.

In an embodiment, the transparent nonconducting material of first optical window 201, second optical window 202, and intermediate frame 203 independently includes, e.g., a dielectric glass such as fused silica or fused quartz. Accordingly, the transparent nonconducting material is transparent to radiation and is electrically nonconducting. The transparent nonconducting material provides insignificant perturbations of the RF field and is advantageous over constructions that include materials that perturb RF fields such as cells made with semiconductor materials, e.g., silicon.

The sizes of atomic vapor cell 200 and cell aperture 206 are provided by first window thickness 209, second window thickness 210, frame thickness 211, or lateral length 212. Planar RF fields are more compatible atomic vapor cell 200 with large size. Moreover, thinner windows 201, 202 are better for decreasing perturbations with RF fields provided such the window thickness has structural integrity. Low power RF measurement and heating are suitable with smaller atomic vapor cell 200. In this regard, first optical window thickness 209, second optical window thickness 210, and intermediate frame thickness 211 independently can be from 1 mm to 50 mm, specifically 50 mm to 2 mm. Lateral length 212 can be from 1 mm to 50 mm, specifically 2 mm to 20 mm. The volume of cell aperture 206 can be from 1000 $mm^3$ to 50000 $mm^3$, specifically from 1 $mm^3$ to 1000 $mm^3$.

Accordingly, atomic vapor cell 200 is configured to detect radiofrequency radiation. It is contemplated that the radiofrequency radiation has a wavelength from 0.1 mm to 105 km.

Atomic vapor cell 200 can be made of various elements and components that are microfabricated, and elements of atomic vapor cell 200 can be various sizes. Elements of atomic vapor cell 200 can be made of a material that is physically or chemically resilient in an environment in which atomic vapor cell 200 is disposed, including coatings applied to external surfaces of atomic vapor cell 200 for environmental protection. The components of atomic vapor cell 200 can be made of the same or different material.

Atomic vapor cell 200 can be made in various ways. It should be appreciated that atomic vapor cell 200 includes a number of optical or mechanical components, wherein such components can be interconnected and placed in communication (e.g., optical communication, mechanical communication, and the like) by physical, chemical, optical, or free-space interconnects. The components can be disposed on mounts that can be disposed on a bulkhead for alignment or physical compartmentalization. As a result, atomic vapor cell 200 can be disposed in a terrestrial environment or space environment. The elements of atomic vapor cell 200 can be made by additive or subtractive manufacturing. In an embodiment, elements of atomic vapor cell 200 are selectively etched to remove various different materials using different etchants and photolithographic masks and procedures. The various layers thus formed can be subjected to joining by anodic bonding, fusion bonding, or another bonding technique capable of hermetic sealing to form atomic vapor cell 200.

In an embodiment, a process for making an atomic vapor cell using anodic bonding includes: providing first optical window 201 consisting essentially of transparent nonconducting material and comprising first window bonding surface 204.1 and first cell window wall 207.1, the transparent nonconducting material of first optical window 201 being essentially free of electrically conductive materials including silicon to minimize distortion of radiofrequency fields by first optical window 201; forming first thin film 214 comprising anodic bonding material 213 on first window bonding surface 204.1; forming second thin film 215 comprising second anodic bonding material 213.2 on first frame bonding surface 205.1 and the second frame bonding surface 205.2; disposing intermediate frame 203 on first optical window 201, intermediate frame 203 consisting essentially of transparent nonconducting material, and comprising: first frame bonding surface 205.1 opposing first window bonding surface 204.1, second frame bonding surface 205.2, and cell frame wall 208, the transparent nonconducting material of intermediate frame 203 being essentially free of electrically conductive materials including silicon to minimize distortion of radiofrequency fields by intermediate frame 203; forming first thin film 214 comprising anodic bonding material 213 on second window bonding surface 204.2; anodically bonding first frame bonding surface 205.1 of intermediate frame 203 to first window bonding surface 204.1 of first optical window 201; disposing second optical window 202 on intermediate frame 203 such that intermediate frame 203 is interposed between first optical window 201 and second optical window 202, and second optical window 202 consisting essentially of transparent nonconducting material and comprising: second window bonding surface 204.2 opposing second frame bonding surface 205.2, and second cell window wall 207.2, the transparent nonconducting material of second optical window 202 being essentially free of electrically conductive materials including silicon to minimize distortion of radiofrequency fields by second optical window 202; anodically bonding second window bonding surface 204.2 of second optical window 202 to second frame bonding surface 205.2 of intermediate frame 203; forming, in response to the anodically bonding, cell aperture 206 bounded by first cell window wall 207.1 of first optical window 201, cell frame wall 208 of intermediate frame 203, and second cell window wall 207.2 of second optical window 202; and hermetically sealing atomic vapor cell 200 in response to anodically bonding first optical window 201 and second optical window 202 to intermediate frame 203 to make atomic vapor cell 200.

In an embodiment, a process for making an atomic vapor cell using anodic bonding includes: providing first optical window 201 consisting essentially of transparent nonconducting material and comprising first window bonding surface 204.1 and first cell window wall 207.1, the transparent nonconducting material of first optical window 201 being essentially free of electrically conductive materials including silicon to minimize distortion of radiofrequency fields by first optical window 201; forming second thin film 215 comprising second anodic bonding material 213.2 on first frame bonding surface 205.1 and second frame bonding surface 205.2; disposing intermediate frame 203 on first optical window 201, intermediate frame 203 consisting essentially of transparent nonconducting material, and comprising: first frame bonding surface 205.1 opposing first window bonding surface 204.1, second frame bonding surface 205.2, and cell frame wall 208, the transparent nonconducting material of intermediate frame 203 being essentially free of electrically conductive materials including silicon to minimize distortion of radiofrequency fields by intermediate frame 203; anodically bonding first frame bonding surface 205.1 of intermediate frame 203 to first window bonding surface 204.1 of first optical window 201; disposing second optical window 202 on intermediate frame 203 such that intermediate frame 203 is interposed between first optical window 201 and second optical window 202, and second optical window 202 consisting essentially of transparent nonconducting material and comprising: second window bonding surface 204.2 opposing second frame bonding surface 205.2, and second cell window wall 207.2, the transparent nonconducting material of second optical window 202 being essentially free of electrically conductive materials including silicon to minimize distortion of radiofrequency fields by second optical window 202; anodically bonding second window bonding surface 204.2 of second optical window 202 to second frame bonding surface 205.2 of intermediate frame 203; forming, in response to the anodically bonding, cell aperture 206 bounded by first cell window wall 207.1 of first optical window 201, cell frame wall 208 of intermediate frame 203, and second cell window wall 207.2 of second optical window 202; and hermetically sealing atomic vapor cell 200 in response to anodically bonding first optical window 201 and second optical window 202 to intermediate frame 203 to make atomic vapor cell 200. In some embodiments first and second windows are made of anodic bonding material 213.

In an embodiment, the process for making an atomic vapor cell using anodic bonding includes forming atomic vapors of alkali metal atoms in cell aperture 206. In certain embodiments, forming the atomic vapors of alkali metal atoms in cell aperture 206 occurs prior to hermetically sealing atomic vapor cell 200. According to an embodiment, forming the atomic vapors of alkali metal atoms in cell aperture 206 occurs after hermetically sealing atomic vapor cell 200.

In an embodiment, the process for making an atomic vapor cell using anodic bonding includes forming additional cell apertures 206, wherein each of the cell apertures 206 are sealed from one another such that each cell aperture 206 is fluidically isolated from all other cell apertures 206.

Figure 1A:
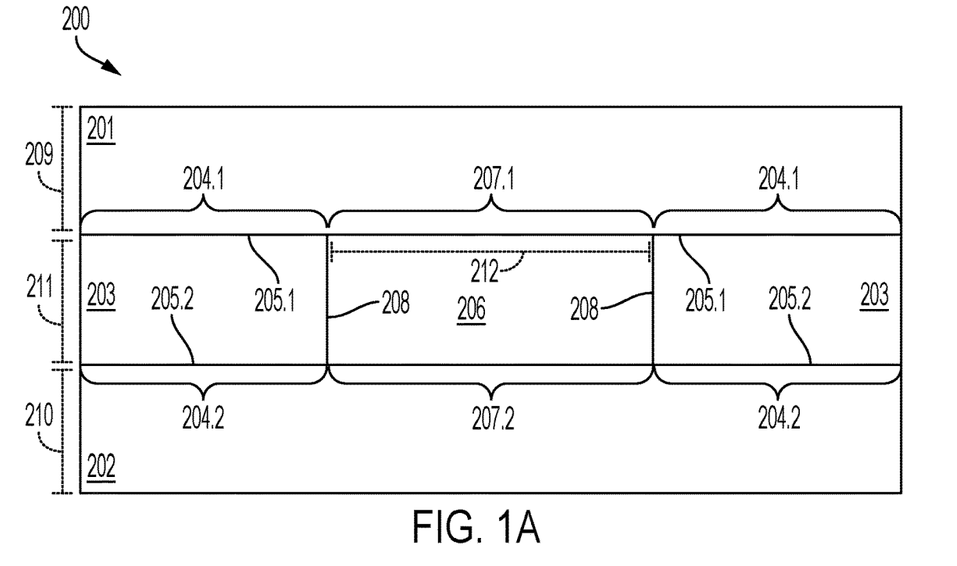
Figure 1B:
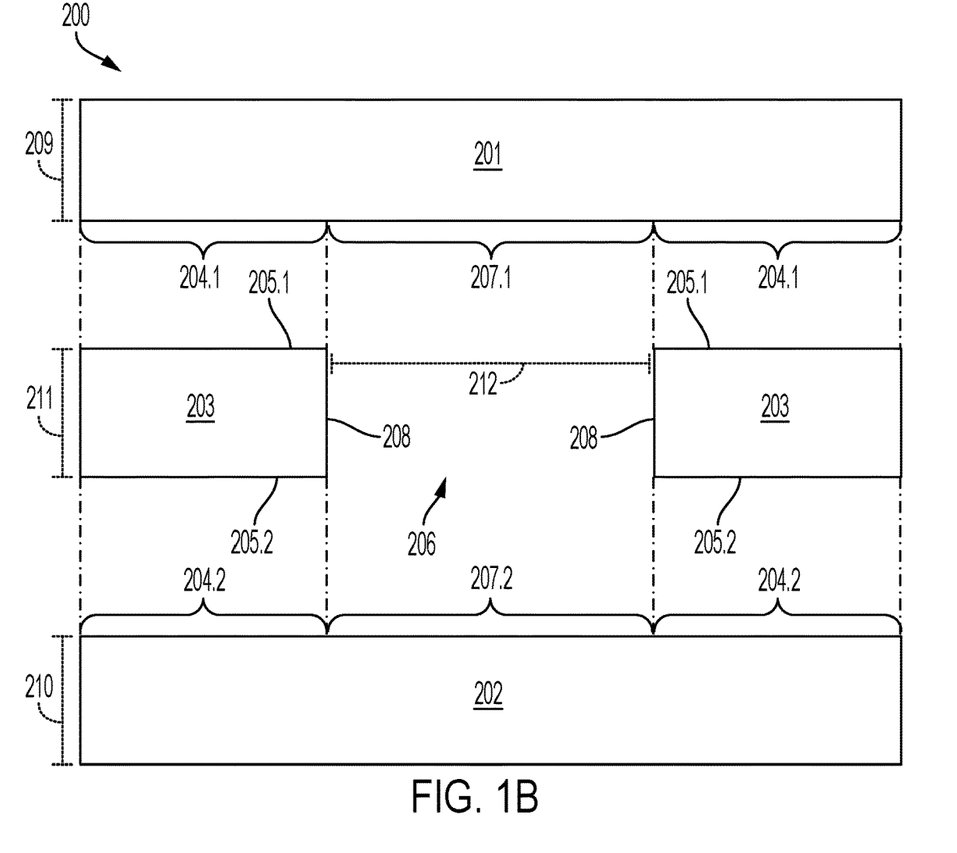
Figure 2A:
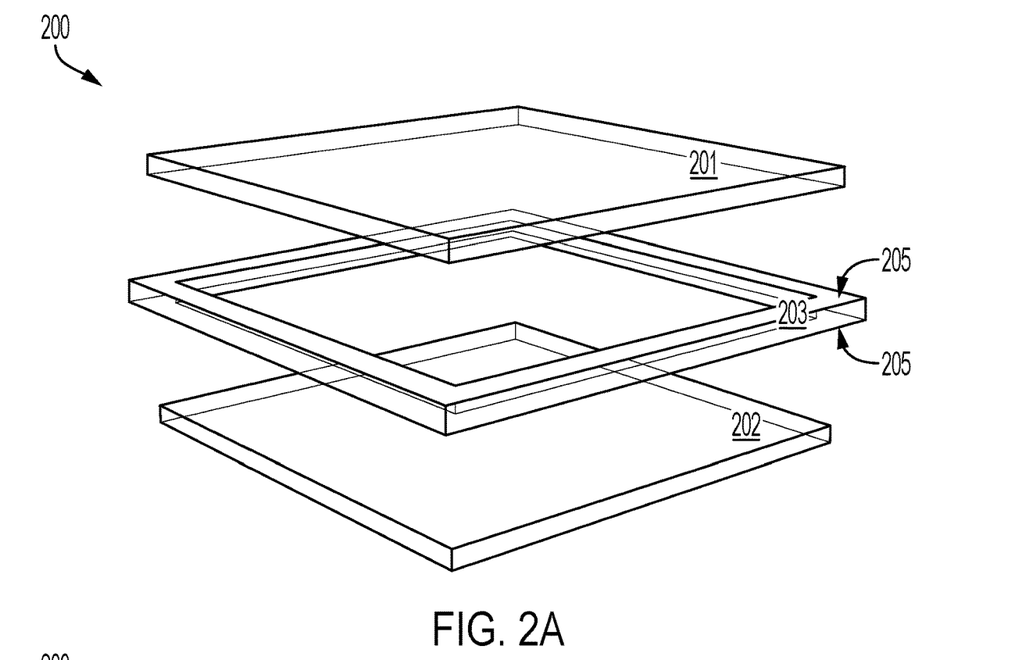
Figure 2B:
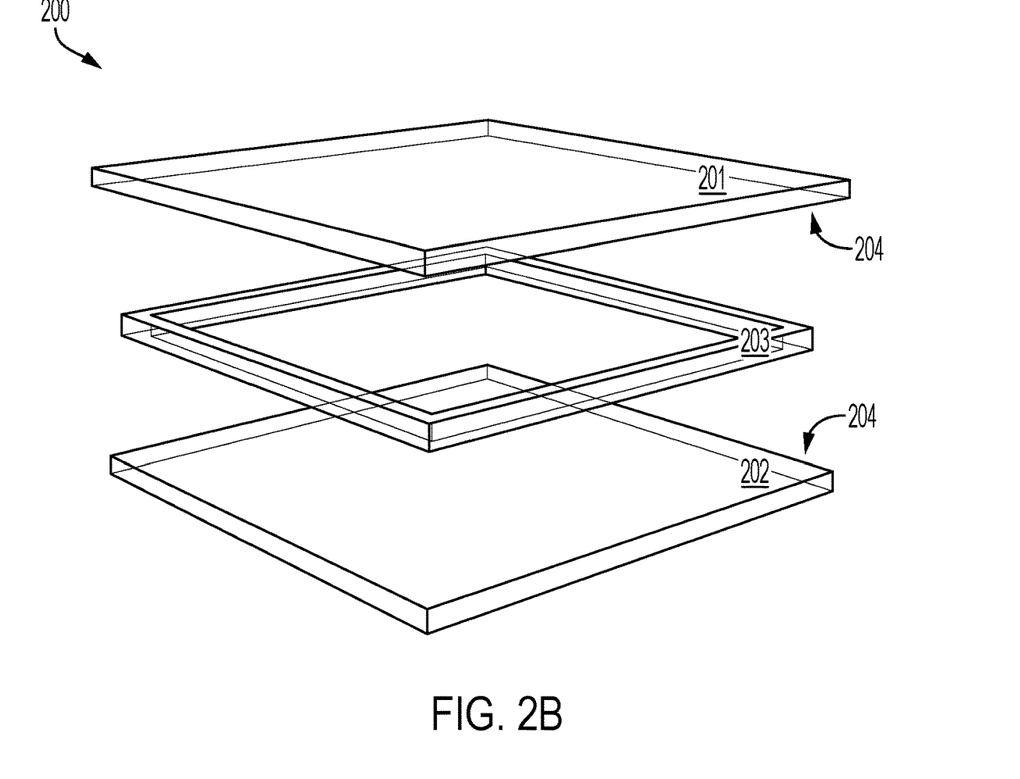
Figure 3:
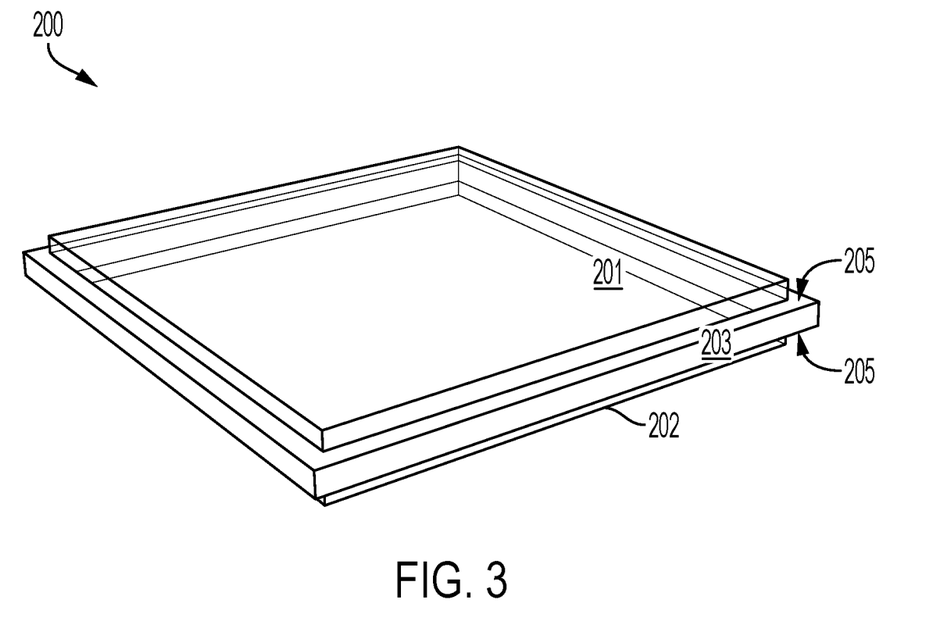
FIG. 3 shows a perspective view of an atomic vapor cell made by anodic bonding.
Figure 4A:
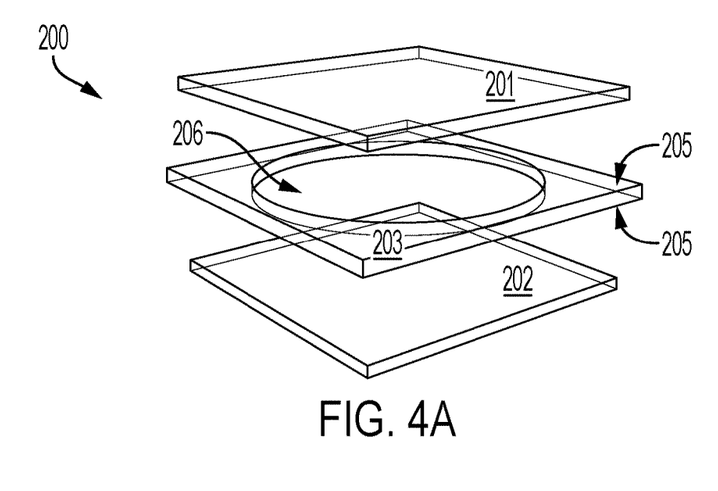
Figure 4B:
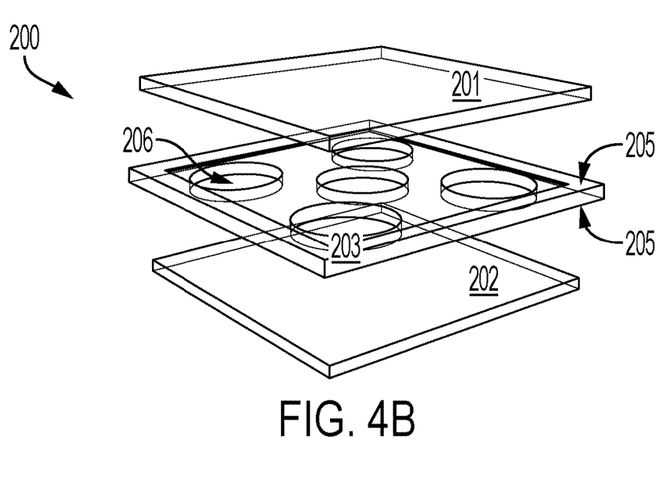
Figure 4C:
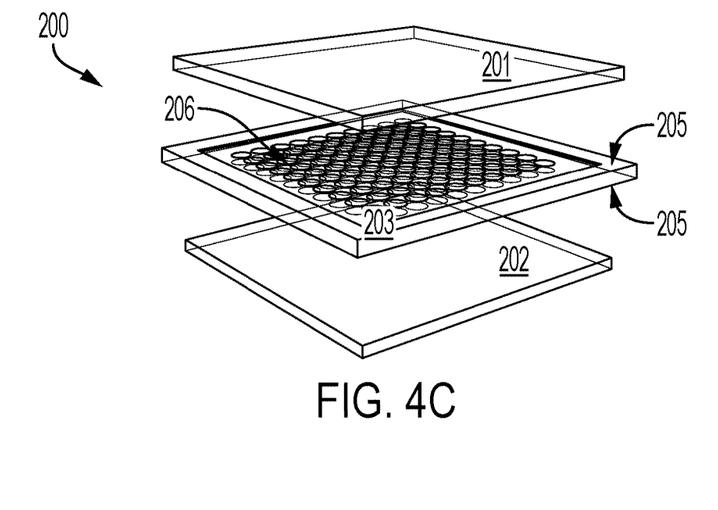
Figure 4D:
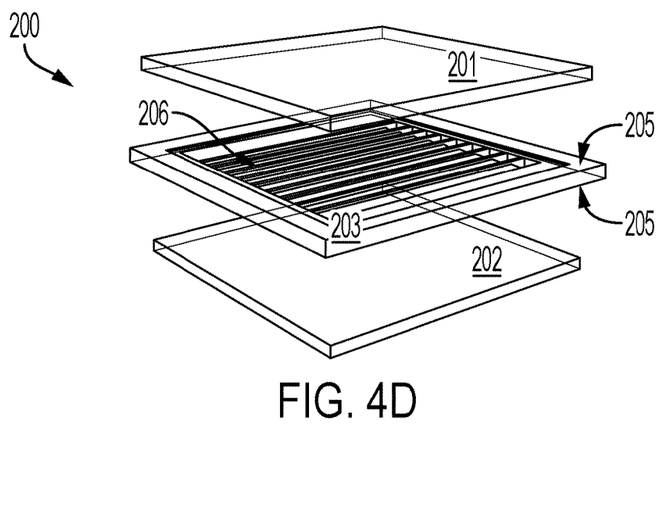
Figure 5A:
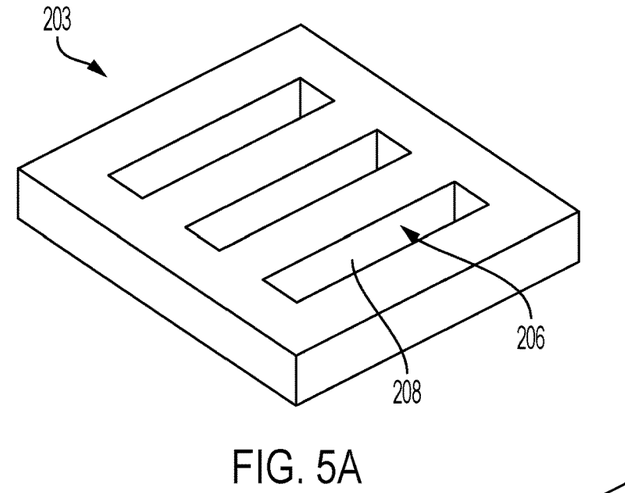
Figure 5B:
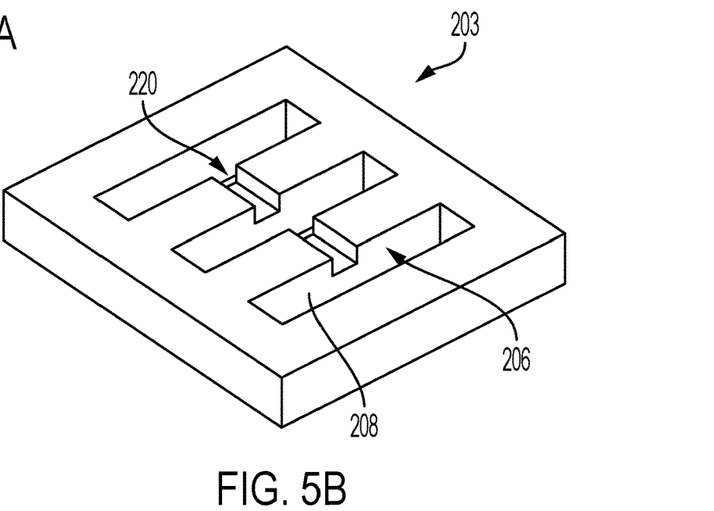
Figure 5C:
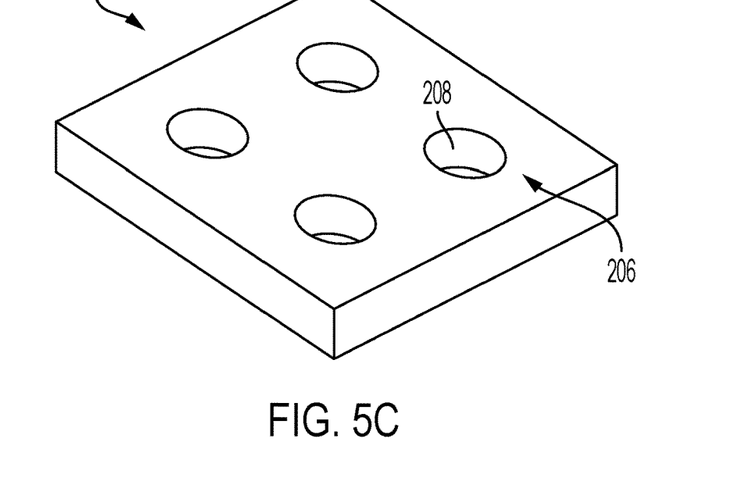

Accordingly, with reference FIG. 2A, it should be appreciated that second anodic bonding material 213.2, e.g., silicon, can be formed on first frame bonding surface 205.1 and second frame bonding surface 205.2 of intermediate frame 203, and first optical window 201 and second optical window 202, e.g., made of anodic bonding material 213, are then anodically bounded to intermediate frame 203 to form atomic vapor cell 200 shown in FIG. 3. Alternatively, with reference FIG. 2B, second anodic bonding material 213.2 is formed on first window bonding surface 204.1 of first optical window 201 and second window bonding surface 204.2 of second optical window 202 that are then anodically bounded to intermediate frame 203, e.g., made of anodic bonding material 213, to form atomic vapor cell 200 shown in FIG. 3. As another option, atomic vapor cell 200 can be made by drilling holes in intermediate frame 203 to form cell aperture 206. The resulting cell aperture 206 bounded by cell frame wall 208 cell window wall 207.1, and cell window wall 207.2 are a reservoir for alkali atomic vapor in atomic vapor cell 200. Forming atomic vapor cell 200 in these manners provides for fabrication of a single vapor cell or an array of vapor cells as shown in FIG. 4. Here, first optical window 201 and second optical window 202 are anodically bonded to this drilled glass plate as intermediate frame 203. For bonding, second anodic bonding material 213.2, e.g., silicon, is formed (e.g., by deposition) on frame bonding surface 205 or on window bonding surface 204, while bonding material 213 is formed on the surfaces opposing those covered by the second bonding material 213.2.

During anodic bonding workpieces (e.g., first optical window 201, intermediate frame 203, second optical window 202) are bonded using a combination of elevated temperature and an applied electric field. The bond is carried out in a controlled gaseous environment that enables inclusion of alkali atom vapor source 216 to be enclosed inside cell aperture 206. Anodic bonding can be performed as described in the Example below or other methods known in the art, e.g., as described in G. Wallis, Field Assisted Glass Sealing, *Electrocomponent Science and Technology*, 1975, 2 (1), 45-53; and K. M. Knowles et al., Anodic Bonding, *International Materials Rev.*, 2006, 51(5), 273-311, the disclosures of which are incorporated by reference in their entirety.

Atomic vapor cell 200 and processes disclosed herein have numerous beneficial uses including measuring the electric field of electromagnetic radiation using the spectroscopic responses of Rydberg atoms to electromagnetic radiation field, wherein the Rydberg atoms are produced from the vapor of alkali atom source 216 that is produced when alkali atom source 216 is heated. An exemplary process is described in U.S. patent application Ser. No. 15/183,010, which is incorporated by reference in its entirety.

Advantageously, atomic vapor cell 200 overcomes limitations and technical deficiencies of conventional devices and conventional processes such as gas cells that include semiconductor, electrically conductive material, or other material that perturb RF fields. It should be appreciated that while conventional gas cells that include silicon for the cell body are known in the art, e.g., as described in U.S. Pat. No. 10,605,840, the present invention excludes such bulk material, and during making atomic vapor cell 200 the second anodic bonding material 213.2 is converted to an oxide composition that does not substantially perturb the RF field. Accordingly, atomic vapor cell 200 can provide higher precision and accuracy for sensing RF fields than conventional devices.

The articles and processes herein are illustrated further by the following Example, which is non-limiting.

EXAMPLE

With reference to FIG. 6, a process for making atomic vapor cell 200 by anodic bonding of non-borosilicate glass substrates includes providing fused silica or other non-borosilicate glass to be used as glass substrates for first optical window 201, second optical window 202, and intermediate frame 203. The glass substrate can have a surface roughness of 20 Angstroms or less. The glass substrates are cleaned of particulate matter. First optical window 201, intermediate frame 203, and second optical window 202 can be masked such that only surfaces (e.g., window bonding surface 204 or frame bonding surface 205) where first optical window 201 and second optical window 202 contact intermediate frame 203 are exposed. It should be noted that intermediate frame 203 can include interframe structure 219 that provide for cell frame wall 208 to cell aperture 206. Masking can be done with a lift-off photoresist or other sacrificial layer. Thereafter, the process proceeds by coating first optical window 201 and the second optical window 202 with first thin film 214 and intermediate frame 203 with second thin film 215; or alternatively coating intermediate frame 203 with first thin film 214 and second thin film 215 and coating first optical window 201 and second optical window 202 with thin films 214 and 215 such that opposing surfaces of the intermediate frame 203 and first and second optical windows 201, 202 are coated with different thin film materials (213.1, 213.2). First thin film 214 can be made from the anodic bonding material 213, and second thin film 215 can be made from second anodic bonding material 213.2 that can be a material that provides for anodic bonding of first optical window 201 and second optical window 202 to intermediate frame 203. The anodic bonding material can be amorphous silicon or polycrystalline silicon that is formed only where the glass substrate is exposed to deposition of first thin film 214 and second thin film 215 such as window bonding surface 204 or frame bonding surface 205. The deposition of first thin film 214 made of the anodic bonding material 213, such as borosilicate glass containing a high concentration of alkali ions, and second thin film 215 made of the second anodic bonding material 213.2 such as silicon can be formed in a variety of ways including radio frequency sputtering, low temperature sputtering, evaporation and plasma enhanced chemical vapor deposition. First thin film 214 and second thin film 215 can be doped. A film thickness of first thin film 214 and second thin film 215 independently can be from 10 nm to 450 nm. If coating intermediate frame 203 with the thin film, frame bonding surface 205.1 and frame bonding surface 205.2 are coated. Optionally, the outside, external walls intermediate frame 203 can be coated too. If coating first optical window 201 or second optical window 202, coating can occur around the external edges thereof for easier electrical access to the internal film layer on window bonding surface 204.

Additionally, the process for making atomic vapor cell 200 can include coating intermediate frame 203 or windows (201, 202) with borosilicate glass thin film containing a high concentration of alkali ions to form anodic bonding material 213, wherein coating occurs only where the glass substrate is exposed. The deposition of this borosilicate layer can be done by a variety of methods including low temperature sputtering or evaporation. The film thickness can be from 10 nm to 450 nm. If coating intermediate frame 203 in this step, the faces 205 of intermediate frame 203 can be coated and optionally the outer walls of intermediate frame 203. If coating windows (201, 202) in this step, all surfaces of windows (201, 202) can be coated.

Thereafter, the process includes removing the sacrificial layer to expose the underlying glass substrate of now-coated first optical window 201, second optical window 202, or intermediate frame 203 followed by cleaning all surfaces to obtain particle-free surfaces. The coated intermediate frame 203 and coated first optical window 201 with deposited thin films are brought together touching and heated from 300° C. to 450° C. with soaking at the elevated temperature from 30 minutes to 2 hours for uniform temperature distribution.

A voltage potential from 800 V to 1100 V is applied from power source 218 between the silicon thin film and borosilicate thin film such that an electric field is generated between the two layers. The applied electric field are oriented such that its direction points from the silicon thin film to the borosilicate thin film. Stepping up the voltage from 700 V to maximum voltage avoids electrical arcing. This step can be completed while applying mechanical pressure to the stack to force the window 201 and frame 203 together. The system is maintained at the elevated temperature with maximum applied voltage for at least 1 hour, particularly for 4 hours or more. While keeping the voltage applied, the temperature of the window and frame stack is decreased to room temperature. When the window and the frame are at room temperature, the voltage is turned off. At this point, first optical window 201 is bonded to intermediate frame 203.

Figure 7:
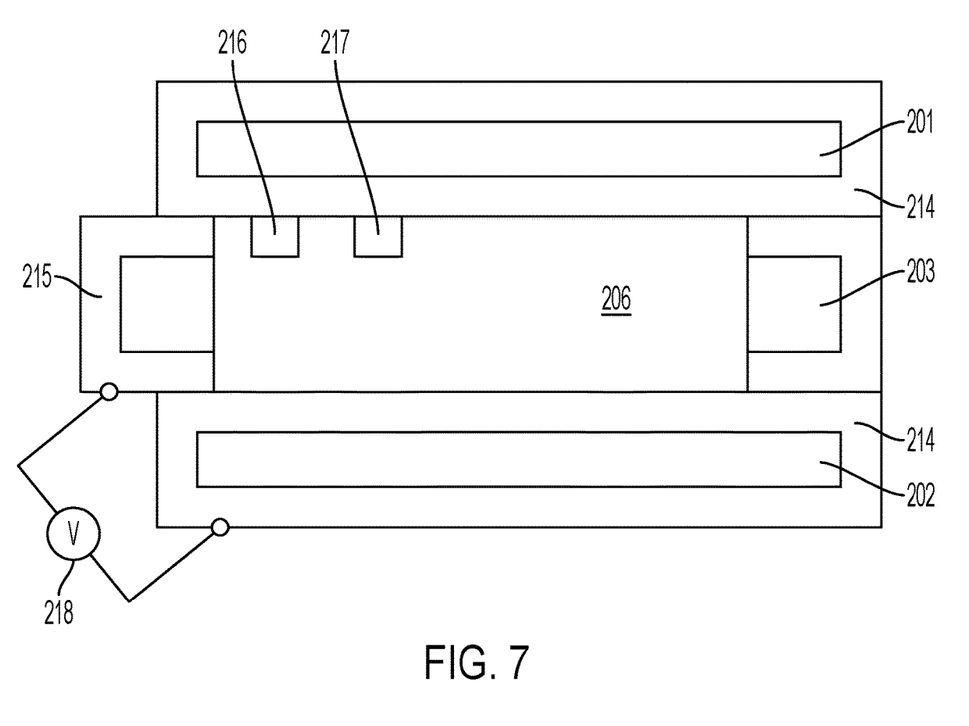
FIG. 7 shows components involved in making the atomic vapor cell according to the Example, wherein the intermediate frame and the second optical window are brought into contact for anodic bonding, such that anodic bond occurs between the lower window and the intermediate frame with an appropriate thin film while a voltage potential applied to the thin film of the intermediate frame and the thin film of the lower window that can be performed in vacuum to evacuate the cell aperture.

After first optical window 201 is bonded to intermediate frame 203, they are disposed in a vacuum chamber. Alkali atom source 216 and getter 217 are disposed on second optical window 202, wherein alkali atom source 216 and getter 217 are activated by controlled local heating, e.g., from laser light, in a subsequent step. Thereafter, second optical window 202 is brought together with second thin film 215 of intermediate frame 203 such that silicon and borosilicate thin films are touching while leaving a small gap therebetween so that gas can be removed the interior of intermediate frame 203 before cell aperture 206 is formed by anodically bonding second optical window 202 to intermediate frame 203. To aid in removing residual gas, the vacuum chamber is evacuated to a pressure that is less than $10^{-7}$ Torr, e.g., $10^{-9}$ Torr. The position of second optical window 202 relative to intermediate frame 203 is manipulated to close the gap between second optical window 202 and intermediate frame 203 as shown in FIG. 7.

The system is then heated from 300° C. to 450° C. and soaked at the elevated temperate from 30 minutes to 2 hours for uniform temperature distribution. A voltage potential is applied between second optical window 202 and intermediate frame 203 of the silicon thin film and borosilicate thin film of second optical window 202 as shown in FIG. 7. The voltage is increased from 700 V to a maximum of 800 V to 1100 V. The voltage potential is applied so that its polarity provides an electric field is directed from the silicon thin film to the borosilicate thin film. Mechanical pressure can be applied to force second optical window 202 into contact with intermediate frame 203. The components are maintained at the elevated temperature with maximum applied voltage for at least 1 hour, and particularly for 4 hours or more. While keeping voltage supply 218 on and applying voltage, the temperature is decreased to room temperature. When first optical window 201, second optical window 202, and intermediate frame 203 are equilibrated to room temperature, the voltage is turned off. At this point, the pressure in the vacuum chamber is increased to ambient pressure, and the anodically bonded atomic vapor cell 200 can be removed from the vacuum chamber.

Alkali atom source 216 is activated in cell aperture 206 by local heating. Laser heating can be used to activate alkali atom source 216. Getter 217 is activated in cell aperture 206 by local heating. Laser heating can be used to activate getter 217. Thus formed, atomic vapor cell 200 is substantially an all-dielectric vapor cell for room temperature Rydberg atom applications involving radio frequency electric field measurements.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. An atomic vapor cell for performing RF measurements, the atomic vapor cell comprising:
   a first optical window consisting essentially of transparent nonconducting material and comprising a first window bonding surface and a first cell window wall, the transparent nonconducting material of the first optical window being essentially free of electrically conductive materials including silicon to minimize distortion of radiofrequency fields by the first optical window;
   an intermediate frame, disposed on the first optical window, consisting essentially of transparent nonconducting material, and comprising: a first frame bonding surface opposing and bonded to the first window bonding surface, a second frame bonding surface, and a cell frame wall, the transparent nonconducting material of the intermediate frame being essentially free of electrically conductive materials including silicon to minimize distortion of radiofrequency fields by the intermediate frame;
   a second optical window disposed on the intermediate frame such that the intermediate frame is interposed between the first optical window and the second optical window, consisting essentially of transparent nonconducting material, and comprising: a second window bonding surface opposing and bonded to the second frame bonding surface, and a second cell window wall, the transparent nonconducting material of the second optical window being essentially free of electrically conductive materials including silicon to minimize distortion of radiofrequency fields by the second optical window;

a cell aperture bounded by the first cell window wall of the first optical window, the cell frame wall of the intermediate frame, and the second cell window wall of the second optical window; and anodic bonding material interposed between the first optical window and the intermediate frame that bonds the intermediate frame to the first optical window and interposed between the second optical window and the intermediate frame that bonds the intermediate frame to the second optical window, wherein the atomic vapor cell is hermetically sealed by bonding between the first optical window and the second optical window to the intermediate frame.

2. The atomic vapor cell of claim 1, further comprising atomic vapors of alkali metal atoms disposed in the cell aperture.

3. The atomic vapor cell of claim 1, further comprising a source of atomic vapors of alkali metal atoms disposed in the cell aperture.

4. The atomic vapor cell of claim 1, further comprising additional cell apertures, wherein each of the cell apertures are sealed from one another such that each cell aperture is fluidically isolated from all other cell apertures.

5. The atomic vapor cell of claim 1, wherein the anodic bonding material is formed from silicon, borosilicate, polycrystalline silicon, or amorphous silicon.

6. The atomic vapor cell of claim 1, wherein the cell aperture comprises a circular cross-section along a lateral length of the cell aperture.

7. The atomic vapor cell of claim 1, wherein the cell aperture comprises an ellipsoidal cross-section along a lateral length of the cell aperture.

8. The atomic vapor cell of claim 1, wherein the cell aperture comprises a quadrilateral cross-section along a lateral length of the cell aperture.

9. The atomic vapor cell of claim 1, wherein the cell aperture comprises a parallelepiped shape.

10. The atomic vapor cell of claim 1, wherein the cell aperture comprises a cylindrical shape.

11. The atomic vapor cell of claim 1, wherein the transparent nonconducting material of the first optical window, the second optical window, and the intermediate frame independently comprise fused silica or fused quartz.

12. The atomic vapor cell of claim 1, wherein the first window thickness of the first optical window is from 1 mm to 10 mm.

13. The atomic vapor cell of claim 1, wherein the second window thickness of the second optical window is from 1 mm to 10 mm.

14. The atomic vapor cell of claim 1, wherein the frame thickness of the intermediate frame is from 1 mm to 10 mm.

15. The atomic vapor cell of claim 1, wherein the volume of the cell aperture is from 1 $mm^3$ to 10 $mm^3$.

16. The atomic vapor cell of claim 1, wherein the atomic vapor cell is configured to detect radiofrequency radiation.

17. The atomic vapor cell of claim 16, wherein the radiofrequency radiation has a wavelength from 0.1 mm to $10^5$ km.

18. A process for making an atomic vapor cell using anodic bonding, the process comprising:

providing a first optical window consisting essentially of transparent nonconducting material and comprising a first window bonding surface and a first cell window wall, the transparent nonconducting material of the first optical window being essentially free of electrically conductive materials including silicon to minimize distortion of radiofrequency fields by the first optical window;

forming a first thin film comprising anodic bonding material on the first window bonding surface;

disposing an intermediate frame on the first optical window, the intermediate frame consisting essentially of transparent nonconducting material, and comprising: a first frame bonding surface opposing the first window bonding surface, a second frame bonding surface, and a cell frame wall, the transparent nonconducting material of the intermediate frame being essentially free of electrically conductive materials including silicon to minimize distortion of radiofrequency fields by the intermediate frame;

forming a second thin film comprising anodic bonding material on the second window bonding surface;

anodically bonding the first frame bonding surface of the intermediate frame to the first window bonding surface of the first optical window;

disposing a second optical window on the intermediate frame such that the intermediate frame is interposed between the first optical window and the second optical window, and the second optical window consisting essentially of transparent nonconducting material and comprising: a second window bonding surface opposing the second frame bonding surface, and a second cell window wall, the transparent nonconducting material of the second optical window being essentially free of electrically conductive materials including silicon to minimize distortion of radiofrequency fields by the second optical window;

anodically bonding the second window bonding surface of the second optical window to the second frame bonding surface of the intermediate frame;

forming, in response to the anodically bonding, a cell aperture bounded by the first cell window wall of the first optical window, the cell frame wall of the intermediate frame, and the second cell window wall of the second optical window; and hermetically sealing the atomic vapor cell in response to anodically bonding the first optical window and the second optical window to the intermediate frame to make the atomic vapor cell.

19. The process of claim 18, further comprising forming atomic vapors of alkali metal atoms in the cell aperture.

20. The process of claim 19, wherein forming the atomic vapors of alkali metal atoms in the cell aperture occurs prior to hermetically sealing the atomic vapor cell.

21. The process of claim 19, wherein forming the atomic vapors of alkali metal atoms in the cell aperture occurs prior to hermetically sealing the atomic vapor cell.

22. The process of claim 18, further comprising forming additional cell apertures, wherein each of the cell apertures are sealed from one another such that each cell aperture is fluidically isolated from all other cell apertures.

23. A process for making an atomic vapor cell using anodic bonding, the process comprising:

providing a first optical window consisting essentially of transparent nonconducting material and comprising a first window bonding surface and a first cell window wall, the transparent nonconducting material of the first optical window being essentially free of electrically conductive materials including silicon to minimize distortion of radiofrequency fields by the first optical window;

forming a first thin film comprising anodic bonding material on the first frame bonding surface;

disposing an intermediate frame on the first optical window, the intermediate frame consisting essentially of transparent nonconducting material, and comprising: a first frame bonding surface opposing the first window bonding surface, a second frame bonding surface, and a cell frame wall, the transparent nonconducting material of the intermediate frame being essentially free of electrically conductive materials including silicon to minimize distortion of radiofrequency fields by the intermediate frame;

forming a second thin film comprising anodic bonding material on the second frame bonding surface;

anodically bonding the first frame bonding surface of the intermediate frame to the first window bonding surface of the first optical window;

disposing a second optical window on the intermediate frame such that the intermediate frame is interposed between the first optical window and the second optical window, and the second optical window consisting essentially of transparent nonconducting material and comprising: a second window bonding surface opposing the second frame bonding surface, and a second cell window wall, the transparent nonconducting material of the second optical window being essentially free of electrically conductive materials including silicon to minimize distortion of radiofrequency fields by the second optical window;

anodically bonding the second window bonding surface of the second optical window to the second frame bonding surface of the intermediate frame;

forming, in response to the anodically bonding, a cell aperture bounded by the first cell window wall of the first optical window, the cell frame wall of the intermediate frame, and the second cell window wall of the second optical window; and hermetically sealing the atomic vapor cell in response to anodically bonding the first optical window and the second optical window to the intermediate frame to make the atomic vapor cell.

24. The process of claim 23, further comprising forming atomic vapors of alkali metal atoms in the cell aperture.

25. The process of claim 23, wherein forming the atomic vapors of alkali metal atoms in the cell aperture occurs prior to hermetically sealing the atomic vapor cell.

26. The process of claim 24, wherein forming the atomic vapors of alkali metal atoms in the cell aperture occurs prior to hermetically sealing the atomic vapor cell.

27. The process of claim 23, further comprising forming additional cell apertures, wherein each of the cell apertures are sealed from one another such that each cell aperture is fluidically isolated from all other cell apertures.

* * * * *